(12) United States Patent  
Lahner et al.

(10) Patent No.: US 7,441,210 B2  
(45) Date of Patent: Oct. 21, 2008

(54) ON-THE-FLY RTL INSTRUCTOR FOR ADVANCED DFT AND DESIGN CLOSURE

(75) Inventors: Juergen K. Lahner, Morgan Hill, CA (US); Juergen Dirks, Holzkirchen (DE); Balamurugan Balasubramanian, Santa Clara, CA (US)

(73) Assignee: LSI Corporation, Milpitas, CA (US)

( * ) Notice: Subject to any disclaimer, the term of this patent is extended or adjusted under 35 U.S.C. 154(b) by 415 days.

(21) Appl. No.: 11/247,630

(22) Filed: Oct. 11, 2005

(65) Prior Publication Data

US 2007/0083839 A1   Apr. 12, 2007

(51) Int. Cl.  
*G06F 17/50* (2006.01)

(52) U.S. Cl. .................. 716/1; 716/4; 716/5; 716/18

(58) Field of Classification Search .............. 716/1–5, 716/10–11, 18  
See application file for complete search history.

(56) References Cited

U.S. PATENT DOCUMENTS

| | | | |
|---|---|---|---|
| 2002/0162086 A1* | 10/2002 | Morgan | 716/18 |
| 2003/0182642 A1* | 9/2003 | Schubert et al. | 716/4 |
| 2003/0208723 A1* | 11/2003 | Killian et al. | 716/1 |
| 2004/0221249 A1* | 11/2004 | Lahner et al. | 716/4 |

* cited by examiner

*Primary Examiner*—Paul Dinh  
(74) *Attorney, Agent, or Firm*—Christopher P. Maiorana, PC

(57) ABSTRACT

A method for developing a circuit design is disclosed. The method generally includes the steps of (A) editing a file for a circuit design based on a plurality of edits received from a designer, the file containing a code written in a hardware description language, (B) characterizing the code in the file while the designer is editing the code to generate a plurality of characterization results and (C) generating a plurality of suggestions to the designer to modify the code based on a comparison of a plurality of goals for the circuit design and the characterization results.

20 Claims, 9 Drawing Sheets

TABLE I

| | TIMING | CONGESTION | AREA | DFT | POWER | RTL CODING STYLE |
|---|---|---|---|---|---|---|
| MULTIPLIER 1 | FAST | MEDIUM | MEDIUM | LOW | NO IMPACT | NO IMPACT |
| MULTIPLIER 2 | MEDIUM | MEDIUM | LOW | MEDIUM | MEDIUM | MEDIUM |
| MULTIPLIER 3 | SLOW | LOW | LOW | HIGH | MEDIUM | MEDIUM |
| MUX STRUCTURE 1 | FAST | MEDIUM | MEDIUM | LOW | NO IMPACT | NO IMPACT |
| MUX STRUCTURE 2 | MEDIUM | MEDIUM | LOW | MEDIUM | MEDIUM | MEDIUM |
| MUX STRUCTURE 3 | SLOW | LOW | LOW | HIGH | MEDIUM | MEDIUM |
| MEMORY INTERFACE 1 | MEDIUM | MEDIUM | LOW | MEDIUM | MEDIUM | MEDIUM |
| ARCHITECTURE STYLE 1 | SLOW | LOW | LOW | HIGH | MEDIUM | HIGH |

FIG. 2

TABLE II

| | TIMING | CONGESTION | AREA | DFT | POWER | RTL CODING STYLE |
|---|---|---|---|---|---|---|
| MULTIPLEXER 1 (DESIGN STRUCTURE BEFORE) | MEDIUM | HIGH | MEDIUM | MEDIUM | MEDIUM | NO IMPACT |
| MULTIPLEXER 2 (DESIGN STRUCTURE AFTER) | MEDIUM | LOW | MEDIUM | MEDIUM | MEDIUM | NO IMPACT |

FIG. 7

ON-THE-FLY RTL INSTRUCTOR FOR ADVANCED DFT AND DESIGN CLOSURE

FIELD OF THE INVENTION

The present invention relates to register transfer language (RTL) design methods generally and, more particularly, to an on-the-fly RTL instructor for advanced design for test (DFT) and design closure.

BACKGROUND OF THE INVENTION

RTL designers currently have no conventional tools available that instruct how to write new RTL code to achieve specific goals. Common specific goals are (i) test coverage goals, (ii) congestion goals, (iii) area goals, (iv) timing goals, (v) power goals (caused by insufficient architectures) and (vi) RTL coding style goals. Currently, the RTL code is initially written and processed (i.e., RTL analysis, synthesis, usage of a related netlist for backend and test tools) before any valuable feedback can be provided to the RTL designer. Due to problems not uncovered until later in the design flow, the RTL code is sometimes changed and steps in the design flow are repeated. The changes and iterations cause inefficient use of valuable resources (i.e., time, people and computation power).

Most of the time, Verilog, VHSIC (Very High Speed Integrated Circuit) Hardware Description Language (VHDL) and other RTL writers have limited knowledge of how the generated RTL code impacts design closure or test. Correlation between issues in design closure/test and the RTL code causing the issues is often not achievable. Sometimes, a correlation between a problem and the RTL code is not identified until late in the design cycle where corrections are expensive.

New circuit designs commonly integrate RTL code that already exists. The integration can be difficult for lack of knowledge if the existing RTL code meets the expected goals (i.e., test, congestion, area, timing, power, and RTL coding style goals) Two categories of existing RTL code are available for integration; legacy RTL code and third-party intellectual property (IP) code. Legacy RTL code is RTL code that has been previously generated for other projects by someone who might not be available anymore. The RTL writer may not know if the legacy RTL code satisfies the expected goals of the current project. Third-party IP code is RTL code generated by another company that sells and distributes certain IP. Again, the RTL writer may not know if the third-party IP code satisfies the expected goals of the current project.

The RTL code is conventionally reviewed manually by a team of engineers following specific criteria (i.e., RTL coding guidelines). The manual review is an inefficient process to analyze RTL code since tens of thousands of lines of code are reviewed making the review difficult. Furthermore, the feedback from such a manual review is commonly very limited. Some RTL code is analyzed automatically and feedback is provided back to the RTL writer. However, (i) conventional automatic analysis does not follow the concept of user-defined goals and (ii) the RTL code must be completed first, and the RTL code is often a major part or the whole design, before the conventional analysis can be performed. As a result, resources are not used efficiently.

Integration of legacy RTL code and/or third-party IP is commonly resource intensive. A considerable amount of time is spent writing the new RTL code to interface and communicate with the existing code. Furthermore, compatibility between the existing RTL code and the defined goals is typically unknown at the time of integration.

A netlist can be analyzed and some feedback can be provided back to the RTL writer by a conventional automated netlist analysis tool. However, correlation between netlist issues back to the RTL code can be very difficult. In addition, valuable resources have already been spent in case RTL code has to be changed to solve the netlist issues. A newly developed netlist can be brought through the backend of a conventional design process and conventional test flows to determine if all design criteria are meet. However, waiting until the back end of the design process is an inefficient approach. Any issues that will lead to RTL code changes or netlist changes will cause certain steps in the design flow to be repeated.

Several issues exist with the conventional approaches to writing new RTL code and integrating existing RTL code. A whole project can be endangered if the RTL code prohibits a successful layout completion, if the power specification is not achieved or if targeted test coverage is not achieved. Valuable resources (i.e., time, people, and computation power) are wasted when RTL code and/or netlists are changed to resolve issues not identified until later in the design flow. RTL designers commonly lack an understanding of design closure/test and how the RTL code impacts backend, design for test and power distribution, making manual checking tedious and sometimes impossible. Furthermore, legacy RTL code and third-party IP RTL code could meet the functional specifications and yet still not satisfy the defined goals established for the project. In a worst-case scenario, the legacy RTL code or third-party IP RTL code purchased or licensed can simply be unusable.

SUMMARY OF THE INVENTION

The present invention concerns a method for developing a circuit design. The method generally comprises the steps of (A) editing a file for a circuit design based on a plurality of edits received from a designer, the file containing a code written in a hardware description language, (B) characterizing the code in the file while the designer is editing the code to generate a plurality of characterization results and (C) generating a plurality of suggestions to the designer to modify the code based on a comparison of a plurality of goals for the circuit design and the characterization results.

The objects, features and advantages of the present invention include providing an on-the-fly RTL instructor for advanced design for test and design closure that may (i) guide a designer to write RTL code for a specified goal and/or purpose, (ii) analyze the RTL code before a defined block of the code and/or an entire design is completed, (iii) enable characterization of existing RTL code for integration purposes, (iv) guide a designer to write design-for-test friendly RTL code, (v) provide a designer with suggestions to write efficient RTL code and/or architecture, (vi) provide a designer with suggestions for an efficient RTL coding style, (vii) reduce turnaround time compared with conventional approaches, (viii) provide a competitive technique for generating RTL code, (ix) provide efficient integration and/or integration of existing (e.g., legacy RTL code and/or third-party RTL code), (x) determine if existing RTL code meets design criteria early in the design flow, (xi) provide characterization of third-party IP RTL code before purchasing and/or licensing, (xii) provide characterization of legacy RTL code, (xiii) enable generation of a library with different RTL code implementations for the same functionality with different characteristics and/or (xiv) guide a designer to make changes to legacy RTL code.

BRIEF DESCRIPTION OF THE DRAWINGS

These and other objects, features and advantages of the present invention will be apparent from the following detailed description and the appended claims and drawings in which:

FIG. 2 is a TABLE I of example attribute values stored in an RTL instructor library;

FIG. 7 is a TABLE II generally illustrating an example congestion improvement;

DETAILED DESCRIPTION OF THE PREFERRED EMBODIMENTS

Figure 1:
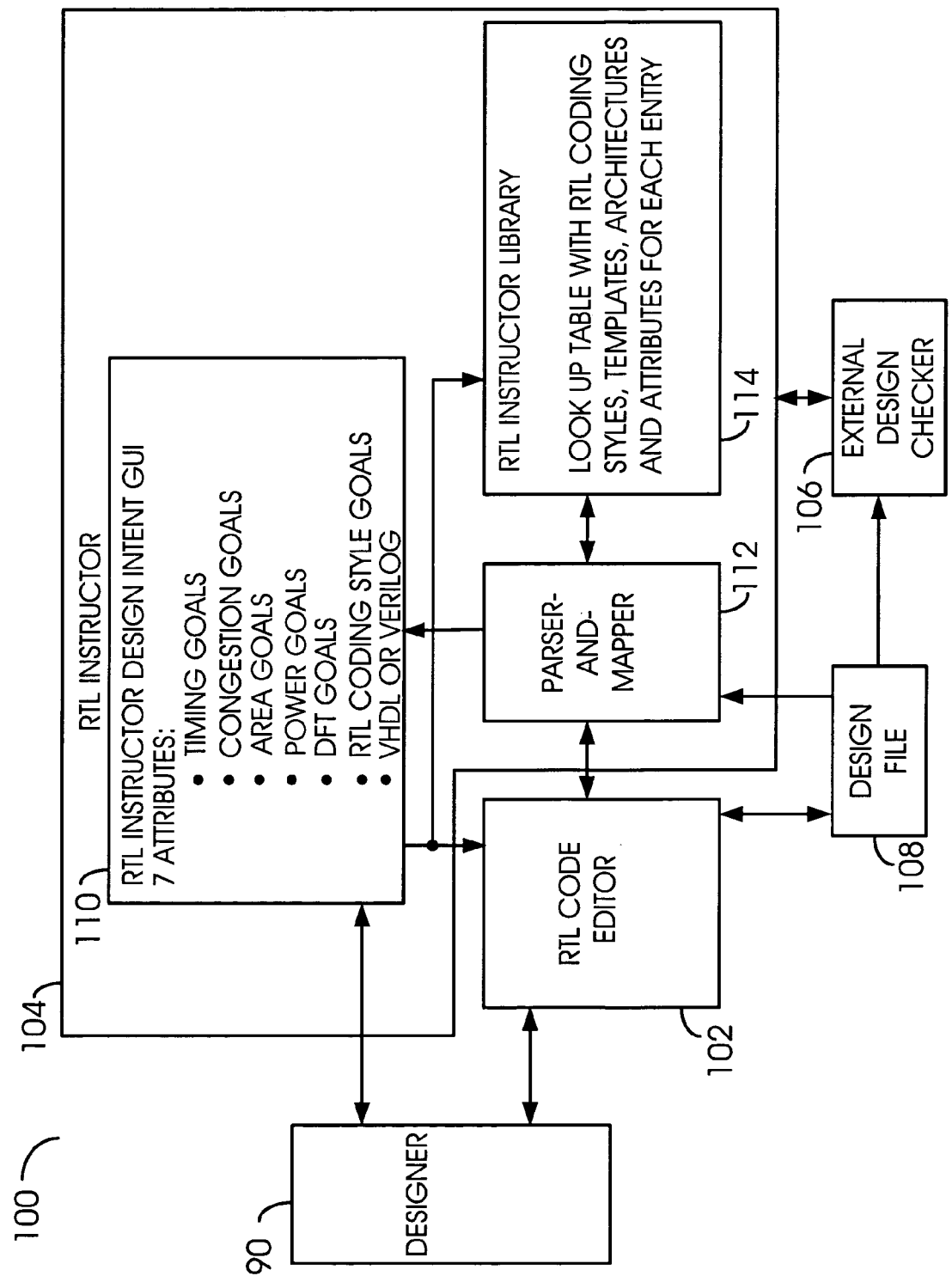
FIG. 1 is a block diagram of a system in accordance with a preferred embodiment of the present invention.

Referring to FIG. 1, a block diagram of a designer 90 and a system 100 is shown in accordance with a preferred embodiment of the present invention. The system (or apparatus) 100 may be a collection of software modules (or blocks) providing a hardware description language (HDL) code editor and an on-the-fly RTL instructor for advanced design for test (DFT) and design closure. In various embodiments, the HDL code may be a register transfer language (RTL) code.

The system 100 generally comprises a software tool (or module) 102, a software tool (or module) 104, a software tool (or module) 106 and a file 108. The software tool 102 may be referred to as a code editor or an RTL code editor tool. The RTL code editor tool 102 may be operational to enable the designer (or user) 90 to read, write and modify the contents of the file 108. In various embodiments, the RTL code editor tool 102 may be a VHDL editor or a Verilog editor. One of ordinary skill in the art would understand how to implement or acquire the RTL code editor tool 102.

The software tool 104 may be referred to as an RTL instructor tool. The RTL instructor tool 104 may be operational to instruct the designer 90 to write an RTL code for a circuit design to achieve certain goals that are generally defined at the start of the design process. The RTL instructor tool 104 may also instruct the designer 90 how to integrate legacy RTL code and third-party RTL intellectual property (IP) code into the circuit design being developed. The RTL instructor tool 104 generally characterizes the RTL code and categorizes the RTL code to determine if the up-front defined goals are satisfied. If not, the RTL instructor tool 104 may provide suggestions to the designer 90 for modifying and integrating existing RTL code (e.g., legacy RTL code and/or third-party IP code) to meet one or more of the goals. The RTL instructor tool 104 may read the RTL code, legacy code and/or third-party code from the file 108 for characterization. The RTL instructor tool 104 may also communicate with the RTL code editor tool 102 to receive automatic code replacements and highlighting information.

The software tool 106 may be referred to as an external design checker tool. The external design checker tool 106 may be one or more tools operational to perform on-the-fly design checks on the full or partial circuit design in the file 108. For example, the external design checker tool 108 may be operational to perform a fanout check of a partially completed circuit design when called from the RTL instructor tool 104. Other design checking operations may be implemented to meet the criteria of a particular application. As used herein, an on-the-fly process generally indicates that the process is performed substantially simultaneously (e.g., in parallel and/or time multiplexed) with some other process.

The file 108 may be referred to as a design file. The design file 108 may be operational to store the RTL code for the circuit design being written. The RTL code in the design file 108 may include, but is not limited to, newly written code, legacy code, third-party code, licensed intellectual property data, purchased intellectual property data, attributes for the software modules (or blocks) of the circuit design and goals for the circuit design. The design file 108 may be accessed for both read and write purposes by the RTL code editor 102. The design file 108 may be readable by the RTL instructor tool 104 and the external design checking tools 106.

The RTL instructor tool 104 generally comprises a software tool (or module) 110, a software tool (or module) 112 and a software tool (or module) 114. The software tool 110 may communicate with the designer 90 to send and receive user information. The software tool 110 may also provide information to the RTL code editor tool 102 and to the software tool 114. The software tool 112 may communicate with the RTL code editor tool 102, the software tool 110, the software tool 114 and the design file 108.

The software tool 100 may be referred to as a graphical user interface (GUI) tool or an RTL instructor design intent GUI tool. The GUI tool 100 may interact with the designer 90 to (i) receive designer-entered information and (ii) provide feedback and suggestions to the designer. The designer-entered information may inform the RTL instructor tool 104 of one or more attributes (or goals) the designer 90 wants applied to the RTL code being generated for the circuit design. The attributes generally comprise (i) timing goals, (ii) congestion goals, (iii) area goals, (iv) power goals, (v) design for test goals, (vi) RTL coding style goals and/or (vii) selection of a particular hardware definition language (e.g., VHDL or Verilog). The GUI tool 100 may interface to the designer 90 through at least a monitor, a keyboard and a mouse.

The software tool 112 may be referred to as a parser-and-mapper tool. The parser-and-mapper tool 112 may be operational to (i) parse functionality from the circuit design in the design file 108 and (ii) map the just-parsed functionality to one or more entries in a library. The RTL code may be read and mapped to functions concurrently and/or on an incremental basis as the designer 90 writes/edits the code for the circuit design. All of the functions (e.g., multiplexer implementations) generally have predefined values with regard to all of the goals. The parser-and-mapper tool 112 may then check if a better design, template and/or improvements for each mapped function are available that would be better to achieve a certain goal or goals (e.g., lower congestions) established by the designer 90.

The software tool 114 may be referred to as an RTL instructor library. The RTL instructor library 114 may be configured to store one or more lookup tables containing the various entries for any higher level functions that may be described in the RTL code in the design file 108. The entries generally include, but are not limited to, (i) one or more multiplexer designs, (ii) one or more multiplier designs, (iii) one or more divider designs, (iv) one or more memory interface designs, (v) one or more memory array designs, (vi) one or more bus structure designs, (vii) one or more circuit architectures and/or (viii) one or more RTL coding styles.

Each of the designs/architecture/styles may have one or more associated attributes. The attributes may vary by entry type where some entries are associated with all attributes and other entries are associated with a subset of the attributes. Example attributes and possible attribute values include, but are not limited to:

Timing: Fast timing, Medium timing, Slow timing, No impact;

Congestion: High congestion, Medium congestion, Low congestion and No impact;

Area: Large area, Medium area, Small area and No impact;

Design For Test: High test coverage, Medium test coverage, Low test coverage and No impact;

Power: High power, Medium power, Low power and No impact; and

RTL Coding Style: Low style, Medium style, High style (e.g., best) and No impact.

Furthermore, a certain numeric value may be assigned to each attribute to enable the designer 90 to calculate a score with regard to each goal (e.g., to determine how good the RTL code was written to achieve a DFT friendly design). The numeric values may be weighted by attribute type (e.g., multiplied by different constants) to emphasize certain criteria for the circuit design.

Referring to FIG. 2, a TABLE I of example attribute values stored in the RTL instructor library 114 is shown. The TABLE I is generally arranged by entry type (e.g., structure) along a particular axis (e.g., a Y-axis) and attributes along the other axis (e.g., an x-axis). Structure type entries having similar functionality (e.g., Multiplier 1, Multiplier 2 and Multiplier 3) may optionally be grouped together. TABLE I may be displayed to the designer 90 through the GUI tool 110.

Links may be provided behind each entry pointing to additional information about the respective entry. For example, entries for specific circuit operations may be linked to one or more templates that may be used to write the RTL code more efficiently. In another example, the circuit operation entries may include links to predefine RTL structures with parameters. Online documentation may be linked to the entries to explain the structure and the impact on all areas. Links may also be provided to the external design checker tools 106 to provide user-initiated and/or automatic on-the-fly design checks. For example, if the RTL instructor tool 104 recognizes that the designer 90 is describing a register array (which may be identified by the RTL instructor 104 using simple Verilog structures), the parser-and-mapper tool 112 may trigger an appropriate external design checking tool 106 to perform a fanin/fanout logic cone check. Based on the results of the fanin/fanout logic cone check, the parser-and-mapper tool 112 may test congestion related topics. In various embodiments, the links may point to other operations and capabilities to meet the criteria of a particular application.

The RTL instructor library 114 may store several implementations for all defined functions (e.g., multiplexers, arithmetic functions, memory interfaces, bus structures, architectures and the like) and preassigned attributes (e.g., fast, medium, slow and no impact). Larger numbers of different characterized implementations generally improve the usefulness of the RTL instructor library 114. The characterization may be based on good design practices already known (e.g., RTL coding guidelines) and RTL codes that have been previously implemented, brought through the design flow and characterized.

Figure 3:
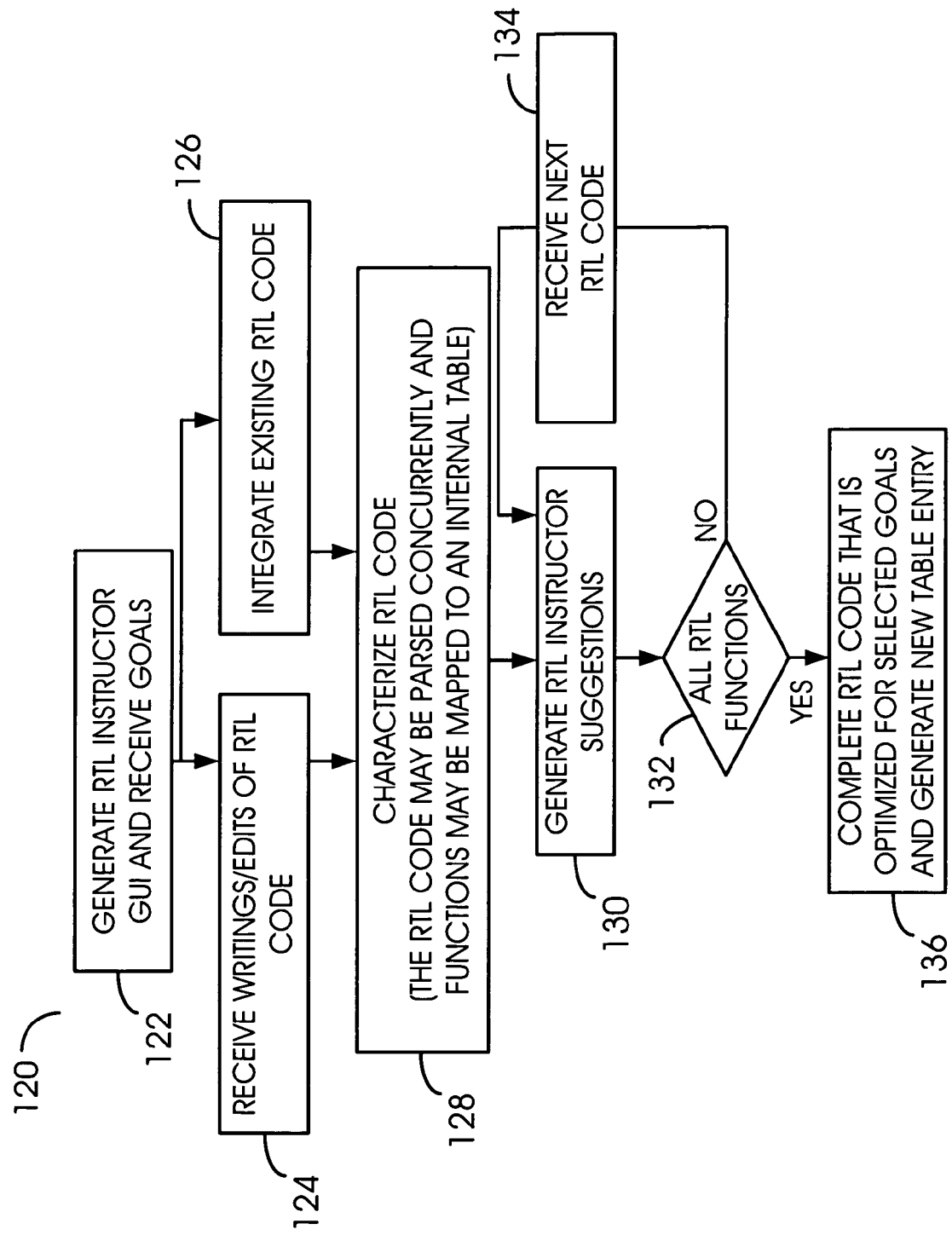
FIG. 3 is a flow diagram of an example process for operating the RTL instructor and an RTL code editor.

Referring to FIG. 3, a flow diagram of an example process 120 for operating the RTL instructor 104 and the RTL code editor 102 is shown. The process (or method) 120 generally comprises a step (or block) 122, a step (or block) 124, a step (or block) 126, a step (or block) 128, a step (or block) 130, a step (or block) 132 and a step (or block) 134.

The process 120 generally begins with the GUI tool 110 generating and presenting a screen to the designer 90 for defining the goals in the step 122. The screen may query the designer 90 for goals for the top circuit design level, for individual sub-components (or modules) of the circuit design and/or for existing code blocks (or modules). Goals available through the screen may include timing goals, congestion goals, area goals, power goals, design for test goals and RTL coding-style goals.

The designer 90 may specify how important each of the available goals are for the particular circuit design or module design. For example, a number may be received by the RTL instructor tool 104 indicating the importance to the designer 90 (e.g., 1=very important, 2=less important and 3=not important). The screen may also enable the designer 90 to identify the particular design file 108 and any related legacy code files and/or third-party code files.

In the step 124, the designer 90 may use the RTL code editor 102 to write and edit the RTL code in the design file 108. In the step 126, the designer 90 may also use the RTL code editor 102 to integrate existing RTL code into the circuit design. Functions defined by the code may be any structure or architecture for the design under development. For example, the functions of the circuit design may include, but are not limited to, a multiplexer, a memory interface, a multiplier, a divider, a memory array, a bus structure, an architecture style, a state machine and the like.

While the designer 90 is editing the circuit design (e.g., steps 124 and 126), the parser-and-mapper tool 112 may be reading the RTL code from the design file 108 in the step 128 either incrementally, as a block of code is completed, or upon receipt of a command from the designer 90. The parser-and-mapper tool 112 may also characterize the RTL code read from the design file 108 in the step 128 by parsing and mapping the functions to the entries in the RTL instruction library 114. The characterization may generate one or more results based on the entries in the RTL instructor library 114 and the goals entered by the designer 90. See FIG. 4 below for additional details.

If the results of the characterization indicate that one or more aspects of the current RTL code do not match or exceed the entered goals, the parser-and-mapper tool 112 may generate a corresponding message for each unmet goal in the step 130. The GUI tool 110 may present the messages as suggestions to the designer 90 in the step 130. The suggestions may provide the designer 90 with ideas for how to adjust the RTL code to reach the goals. If all of the characterization results achieve or exceed the goals, then either no message, or a message indicating that all goals are being meet may be generated in the step 130.

Furthermore, whenever the RTL instructor tool 104 recognizes that a certain function is being described (e.g., a memory interface) and/or whenever the designer 90 indicates through the GUI that help with a certain function is desired, the parser-and-mapper tool 112 and GUI tool 110 may generate a pop-up window that shows different RTL coding styles and/or templates to implement the selected function. All of the attributes (e.g., timing, area, DFT, etc.) assigned to the displayed function may be presented to the designer 90 along with a mechanism for selecting among the different styles and templates. In various embodiments, the parser-and-mapper tool 112 may execute an autocomplete function that provides certain templates to the designer 90.

In the step 132, the parser-and-mapper tool 112 may determine if any functions remain un-characterized in the circuit/module design. If one or more un-characterized functions remain (e.g., the NO branch of step 132), the RTL code tool 102 may receive additional edits and/or integrations from the designer 90. If the circuit/module design has been fully characterized by the RTL instructor tool 104, (e.g., the YES branch of step 132), the RTL code in the design file 108 may be considered optimized for the particular design goals. The parser-and-mapper tool 112 may generate a new table entry in the RTL instructor library 114 for the just-completed RTL code in the step 138. The RTL code may then continue with conventional circuit design processing such as synthesis, place and route, static timing analysis, design rule checking and the like.

Figure 4:
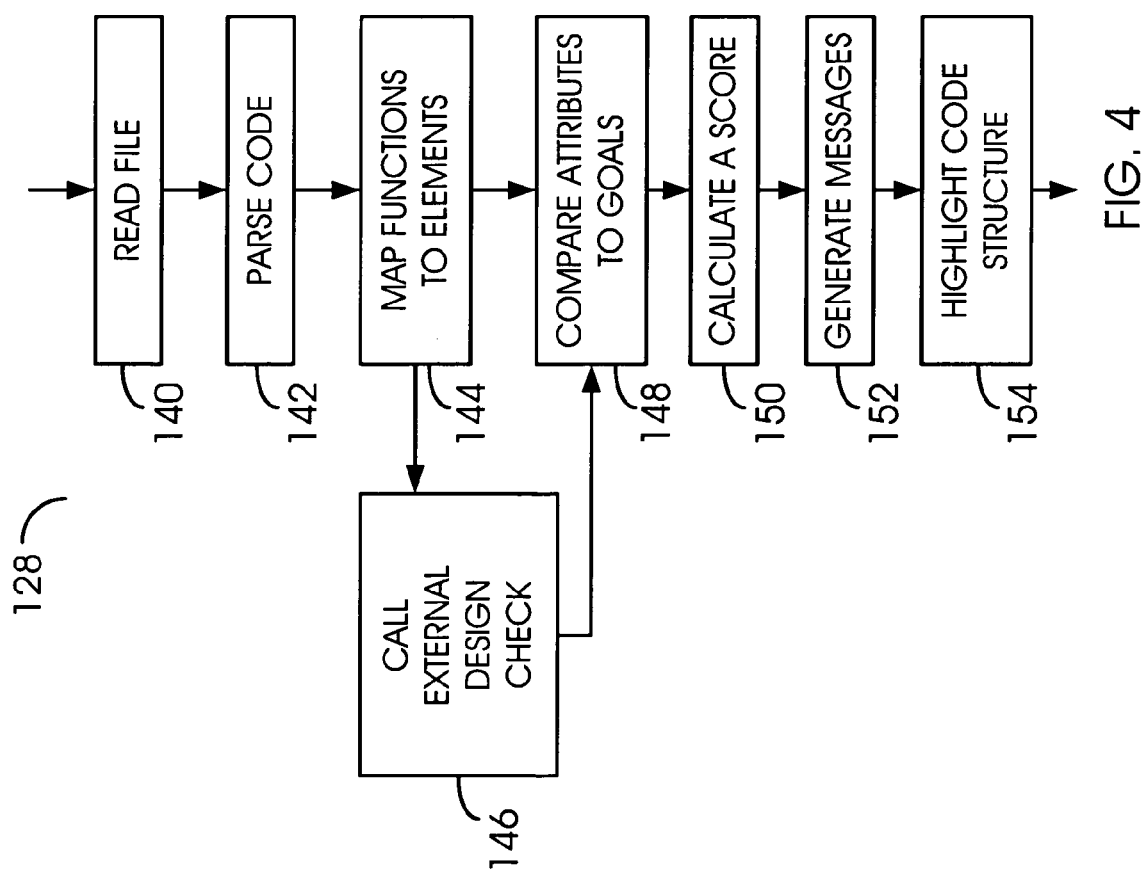
FIG. 4 is a detailed flow diagram of an example implementation of a characterization process.

Referring to FIG. 4, a detailed flow diagram of an example implementation of the characterization process (step 128) is shown. The characterization step 128 generally comprises a step (or block) 140, a step (or block) 142, a step (or block) 144, a step (or block) 146, a step (or block) 148, a step (or block) 150, a step (or block) 152 and a step (or block) 154. Characterization may begin with the parser-and-mapper tool 112 reading the RTL code from the design file 108 in the step 140. The parser-and-mapper tool 112 may parse the just-read code to identify one or more functions defined by the code in the step 142. Mapping of the identified functions to the entries in the RTL instructor library 114 may be performed in the step 144 by the parser-and-mapper tool 112.

If the designer 90 commands an external design check and/or the parser-and-mapper tool 112 determines that the external design check should be performed, one or more external design checking tools 106 may be invoked in the step 146 to analyze the functionality under consideration. Afterwards, the parser-and-mapper tool 112 may compare the results of the mapping and/or external design check against the stored goals for the circuit/module design in the step 148. A score may be calculated by the parser-and-mapper tool 112 in the step 150 to indicate how well the RTL code matches the goals (e.g., design for test) in the effort to achieve design closure. One or more appropriate messages indicating the results of the comparison may be generated by the parser-and-mapper tool 112 in the step 152 to inform the designer 90 of the characterization process.

In the step 154, the parser-and-mapper tool 112 may provide information to the RTL code editor tool 102 for highlighting one or more code structures in the RTL code stored in the design file 108. The highlights may flag certain areas of the code structure useful in achieving a certain goal. For example, if the goal is to have an RTL code that provides less congestion but a structure is being used that is not congestion friendly, the section of code causing the congestion may be visually flagged (e.g., red color) for easy identification by the designer 90. Highlighting may also be used to indicate portions of the RTL code that may be achieving a certain goal (e.g., green color).

The RTL instructor tool 104 generally does not rely on a separate synthesis step in order to characterize the RTL code. The circuit design may be concurrently captured by the RTL instructor tool 104 through intelligent concurrent quick mapping of the RTL code to abstract structures. The RTL instructor tool 104 may behave as an expert system running in the background of the code editing/integration tasks to support the designer 90 in several categories.

The RTL instructor tool 104 may help the designer 90 in timing goals, congestion goals and circuit layout area goals. The effect is generally to enable the designer 90 to characterize and/or implement architectures that may be easy to implement in layout leading to a reduction of layout turnaround time or achieving timing closure at all. The RTL instructor tool 104 may aid in reaching power goals by characterizing, suggesting structures and/or suggesting architectures that generally consume less power than the circuits/modules currently being entered into the RTL code.

The design for test goals generally enable the designer 90 to characterize and implement architectures that may lead to high test coverages and the reduction of test vectors for a certain test coverage. The RTL coding style goals may allow the designer 90 to define a best possible RTL coding style for a design. The RTL instructor tool 104 generally reads and characterizes the available RTL code and reports if the characterized code is timing, congestion, area, DFT, and/or power friendly.

To check if the circuit being designed meets one or more goals, the RTL instructor tool 104 may run in the background. The checking may verify if memories are being implemented correctly. If issues are uncovered with the memory related code, the RTL instructor tool 104 may suggest certain changes to one or more memory interfaces to optimize the implementation with regards to the goals. The instructor may be operational to suggest several different implementation styles that the designer 90 may select among.

The RTL instructor tool 104 may check the RTL code to verify that enough controls and observability points are being implemented. The messages (reports) to the designer 90 may include the existing control points and observability points found in the RTL code. If the number of either or both of the control points and observability points are not sufficient (e.g., less that the stated goals), the RTL instructor tool 104 may generate suggestions for implementing additional control points and/or observation points.

The external design checkers 106 may test the circuit design such that fanout cones and fanin cones follow certain guidelines (e.g., no cone should be larger than a predetermined number of starting/ending nodes). The RTL instructor tool 104 may split fanout cones automatically and may add/suggest pipelines stages for fanin cones. Furthermore, the RTL instructor tool 104 may generate suggestions for gating clock networks to reduce unnecessary switching and therefore conserve power.

The designer 90 may be provided with options through the GUI tool 110 to select a certain architecture style among one or more categories of architecture styles. In particular, the GUI tool 110 may (i) present several different RTL coding styles and (ii) supply the designer 90 with suggestions for arithmetic operators such as multipliers and dividers. The designer 90 may also specify a certain style of multiplexer (e.g., priority multiplexers vs. non priority multiplexers) for use in the circuit design. The RTL instructor tool 104 may respond to the designer's specification by suggesting certain multiplexer styles from the RTL instructor library 114. The designer 90 may define a style goal establishing an importance level for the RTL coding style. For experienced RTL developers, any RTL code style may be selected as little feedback from the RTL instructor tool 104 is expected. For inexperienced RTL designers, the best (highest) RTL coding style may be selected by the developer 90 to gain the full benefits of the knowledge stored in the RTL instructor tool 104.

Figure 5:
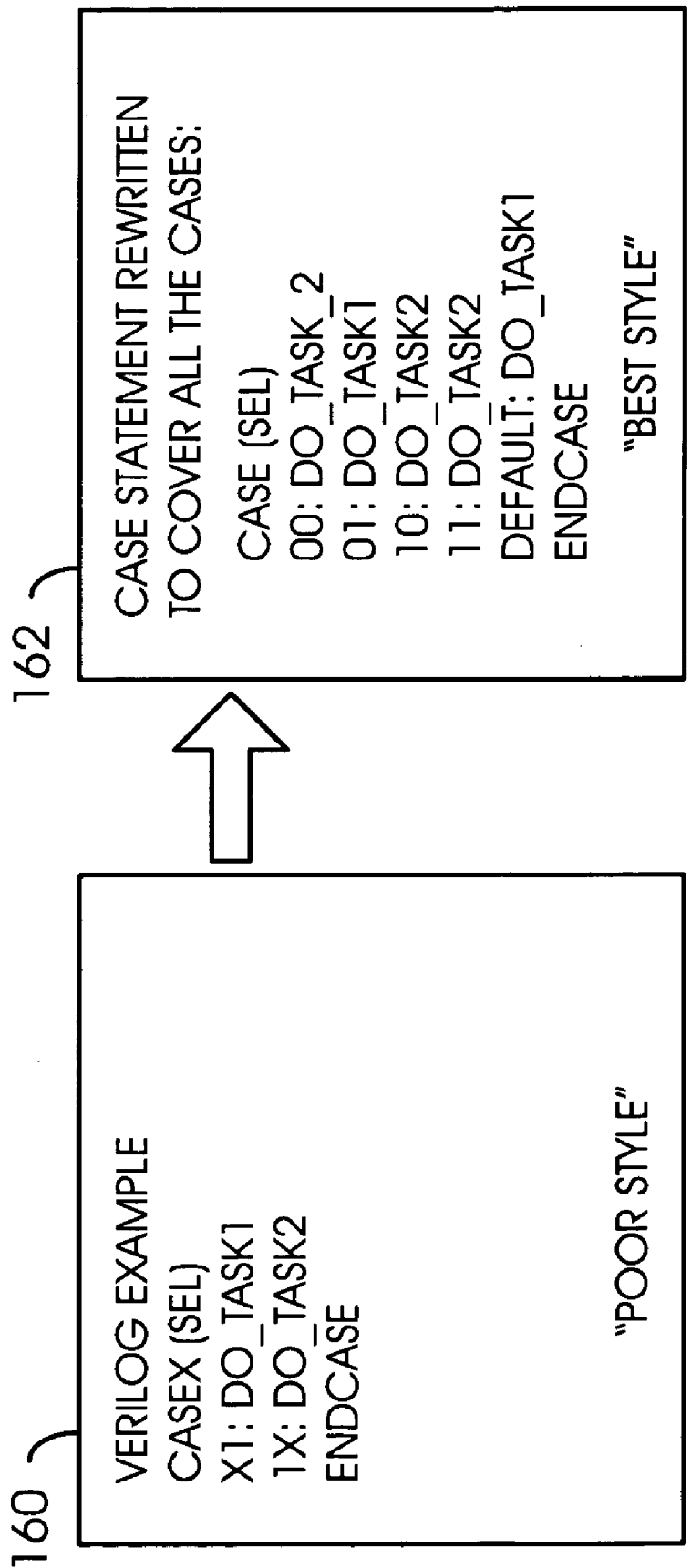
FIG. 5 is a diagram of an example improvement of an RTL coding style.

Referring to FIG. 5, a diagram of an example improvement of an RTL coding style is shown. The coding style illustrated in box 160 generally represents a "poor style" of RTL code for a case function (e.g., CASEX). For example, the code in the box 160 lacks a default condition. Furthermore, if the select value is "11" (e.g., X=1), then both specified cases may be true simultaneously with no indication of which has priority. The coding style illustrated in the box 162 generally represents a "best style" of RTL code for the same function CASEX. In the box 162, all possible select values are uniquely defined and a default condition is stated.

If the CASEX structure in the box 160 is detected and the RTL coding style was selected by the designer 90 as a goal, the RTL instructor tool 104 may flag the structure and suggest the best RTL coding style of the box 162. If the designer 90 decides to adopt the better coding style of the box 162, the parser-and-mapper tool 112 may automatically transfer the structure (162) to the RTL code editor tool 102 for use for the RTL generation. In the example shown, the Verilog code in the box 160 may be replaced with the code in the box 162.

Figure 6:
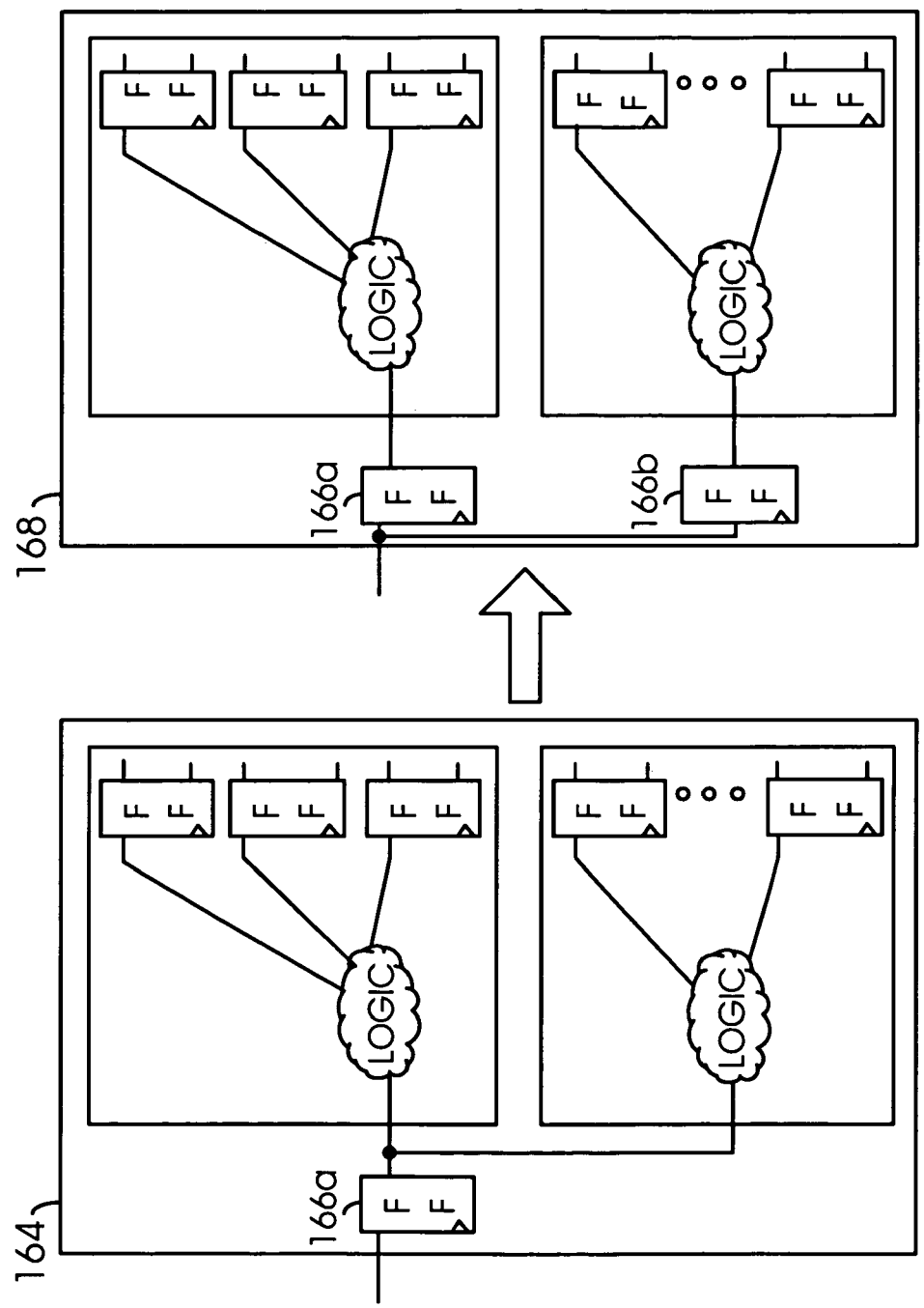
FIG. 6 is a diagram of an example improvement of congestion and testability.

Referring to FIG. 6, a diagram of an example improvement of congestion and testability is shown. A box 164 generally illustrates a circuit design having a large fanout from a flip-flop 166a. A box 168 generally illustrated an improved circuit design suggested by the RTL instructor tool 104 having two smaller fanout cones (e.g., one cone from flip-flop 166a and another cone from flip-flop 166b). If RTL instructor tool 104 detects that the fanout cone from the flip-flop 166a has too many endpoints (e.g., 10,000), the RTL instructor tool 104 may either (i) suggest to the designer 90 or (ii) automatically add one or more additional flip-flops (e.g., 166b) in the RTL code to split the fanout cone, as shown in the box 168.

Referring to FIG. 7, a TABLE II generally illustrating an example congestion improvement is shown. In the example, the parser-and-mapper tool 104 may have mapped an RTL code function to a particular multiplexer function (e.g., MULTIPLEXER 1) in the RTL instructor library 114. The RTL instructor tool 104 may suggest to the designer 90 that another multiplexer structure (e.g., MULTIPLEXER 2) may be substituted for the current (before) structure to decrease the congestion from a high level to a low level. The suggestion may be performed by displaying all of TABLE II or displaying the MULTIPLEXER 2 column.

Figure 8:
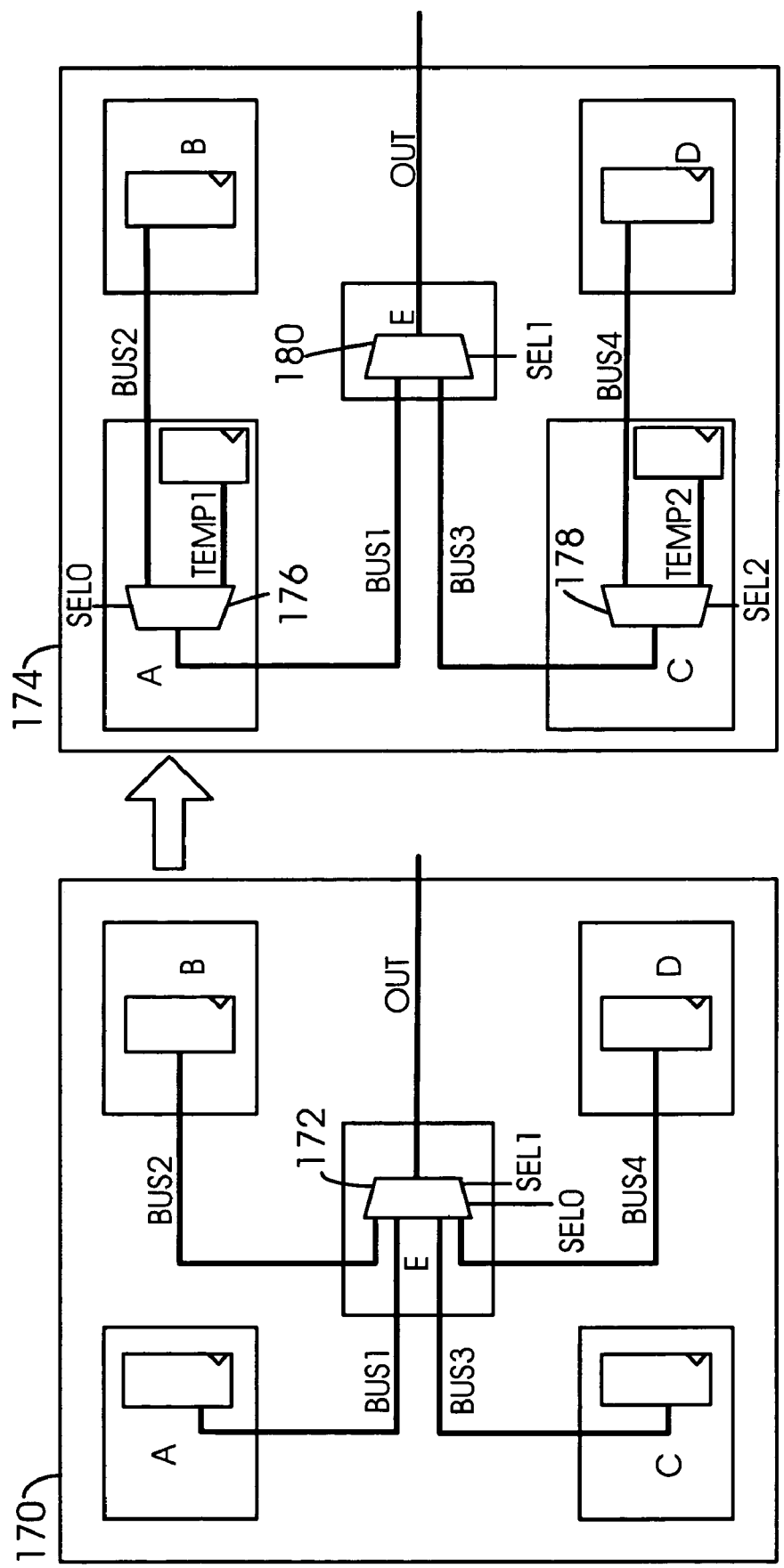
FIG. 8 is a diagram of the multiplexer structures of TABLE II.

Referring to FIG. 8, a diagram of the multiplexer structures of TABLE II is shown. In the box 170, the MULTIPLEXER 1 structure generally comprises several (e.g., four) signals (e.g., BUS1-BUS4) from four different modules A-D meeting at a single multiplexer 172 in a module E. In the box 174, the MULTIPLEXER 2 structure generally replaces the single congested multiplexer 172 in the module E with multiple (e.g., three) fewer-input multiplexers 176, 178 and 180 spread out among the other modules. In the example shown, (i) the two-input multiplexer 176 may be disposed in the module A to multiplex the signals BUS1 and BUS2, (ii) the two-input multiplexer 178 may be disposed in the module C to multiplex the signals BUS3 and BUS4 and (iii) the four-input multiplexer 172 may be replaced by the two-input multiplexer 180. Following the suggestion from the RTL instruction tool 104 may result in fewer traces (wires) entering the module E and thus decreasing the congestion in and around the module E.

Figure 9:
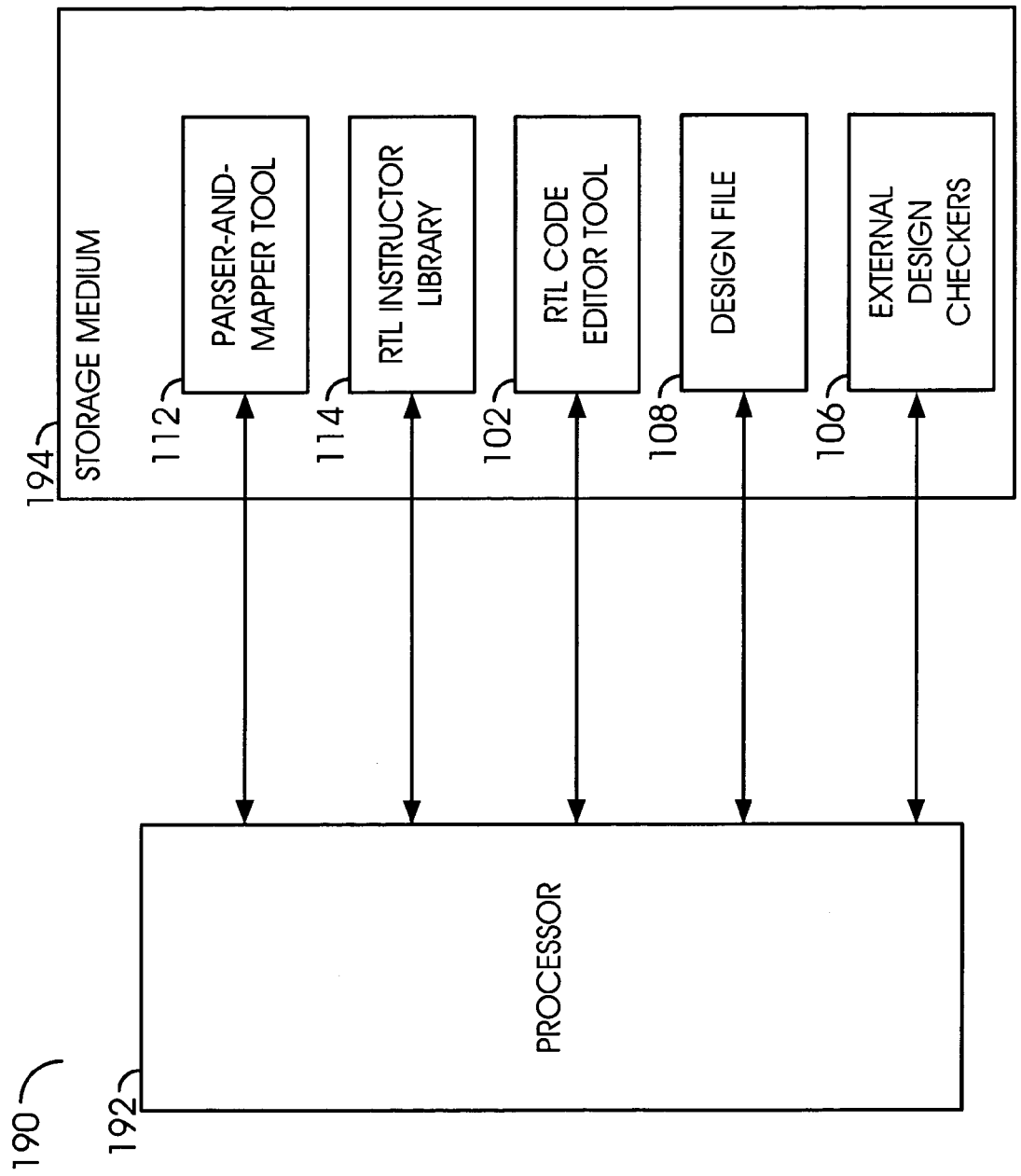
FIG. 9 is a block diagram of an example apparatus hosting the RTL instructor tool.

Referring to FIG. 9, a block diagram of an example apparatus (or circuit) 190 hosting the RTL instructor tool 104 is shown. The apparatus 190 generally comprises a computer 192 and one or more storage media 194 (one shown). The storage medium 194 may store (i) the software programs (tools) 102, 104 and 106 and (ii) the design file 108.

The software programs 102, 106, 112 and 114 may be read and executed by the computer 192 to implement the on-the-fly RTL instruction process for advanced design for test and design closure. In one embodiment, the software programs 102, 106, 112 and 114 and design file 108 may be separately stored in multiple storage medium. For example, the software programs 102, 106, 112 and 114 may be stored on a first hard drive while the design file 108 is stored in a FLASH memory.

The RTL instructor tool 104 generally guides a designer to write RTL code that is being generated for a certain purpose/goal. Characterization and checking of the RTL code may be started by the RTL instruction tool 104 before the code is completed (e.g., for a block within the design or the whole design). The simultaneous characterization of the design may result in short or no delays from the time the code is finished until proceeding with the rest of the design flow. The RTL instructor tool 104 generally enables designers to characterize existing RTL code (e.g., legacy code and/or third-party IP RTL code) for easier integration on the existing code. Furthermore, instead of waiting to see what test coverage a designer may get with a certain RTL code or netlist, a designer is generally guided to write DFT friendly RTL code by the RTL instructor tool 104.

Using the present invention, the code may be developed from the start with one or more target goals in place. For example, the designer may be coding for a low power goal so the RTL instructor tool 104 may suggest gated clocks. Similar suggestions may be generated by the RTL instructor tool 104 for arithmetic structures based on the user-entered goals. A designer intent is generally captured before generating the RTL coding and, based on the intent, the RTL instructor tool 104 may present suggestions resulting in an efficient method to write RTL code.

By selecting a best possible architecture and/or RTL coding style for a certain goal, the RTL instructor tool 104 generally provides a designer (writer) with a mechanism to be as efficient as practical. The suggestions presented by the tool 104 generally result in a turnaround time savings. The time savings may be due, in part, to an elimination of time-consuming loops in the design flow since the RTL designer may generate the RTL code following overall goals as described above.

The RTL instructor tool 104 may be operational to characterize existing code before significant investments in time, money and/or people are made. The existing RTL code to be integrated may be read and characterized to determine if the existing RTL code meets the defined goals. The characterization analysis may be completed (i) before the existing code is synthesized and (ii) before any layout tasks start. Someone who wants to purchase third-party code IP may request to have the RTL instructor tool 104 characterize the code before being licensed or purchased. Where the existing code is legacy code from within a company, the RTL instruction library 114 may be filled with RTL implementations for the same functionality. For example, one or more core circuit designs with the same functionality as the circuit being written may be available to meet the highest performance goals or the DFT goals. If the legacy code has to be implemented and changed, the RTL instructor tool 104 may guide the designer to make changes that may be difficult to make manually.

The RTL instructor tool 104 may be used for any application specific integrated circuit (ASIC), platform ASIC, structured ASIC and field programmable gate array, designs. The RTL instructor tool 104 may be licensed to any IP vendor and/or standards organization (e.g., Virtual Socket Interface Association) for quality IP metric activities.

The function performed by the flow diagrams of FIGS. 3 and 4 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMS, Flash memory, magnetic or optical cards, or any type of media suitable for storing electronic instructions. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. A method for developing a circuit design, comprising the steps of:
    (A) editing a file of said circuit design based on a plurality of edits received from a designer, said file containing a code written in a hardware description language;
    (B) characterizing said code in said file while said designer is editing said code to generate a plurality of characterization results, said characterization results identifying (i) a first of a plurality of functions in said code and (ii) a first of a plurality of coding styles being used to create said first function; and
    (C) generating a plurality of suggestions to said designer to modify said code based on a comparison of a plurality of goals associated with said circuit design against said characterization results, wherein (i) said suggestions comprise (a) a first code template of said first function and (b) a second of said coding styles suitable to implement said first function, (ii) said goals comprise at least two of (a) a timing goal, (b) a congestion goal, (c) an area goal, (d) a design-for-test goal, (e) a power goal and (f) a coding style goal, and (iii) all of said editing, said characterizing and said generating of said suggestions occur before any of (a) logic synthesis and (b) design rule checking are performed on said circuit design.

2. The method according to claim 1, further comprising the steps of:
    generating a graphical user interface to said designer to enable said designer to enter an identification of a second of said functions; and
    generating an additional one of said suggestions comprising a plurality of second code templates to implement said second function.

3. The method according to claim 1, wherein said hardware description language comprises a register transfer language.

4. The method according to claim 1, wherein the step (B) comprises the sub-step of:
    parsing said code in said file to identify said functions defined in said code.

5. The method according to claim 4, where the step (B) further comprises the sub-step of:
    mapping said functions to a plurality of entries in a library.

6. The method according to claim 5, wherein (i) at least a first one of said entries comprises a low power architecture and (ii) at least a second one of said entries comprises a medium power architecture.

7. The method according to claim 5, wherein (i) at least a first one of said entries comprises a best of said coding styles, (ii) at least a second one of said entries comprises an intermediate of said coding styles, (iii) at least a third one of said entries comprises a weakest of said coding styles and (iv) at least a fourth one of said entries comprises a no-impact coding style of said coding styles.

8. The method according to claim 1, wherein said code comprises a plurality of blocks and said characterizing begins before each of said block completes said editing.

9. The method according to claim 1, wherein said characterizing begins before said code completes said editing.

10. The method according to claim 1, further comprising the steps of:
    integrating a block of existing code into said file;
    characterizing said block of existing code to generate a plurality of existing code results; and
    generating at least an additional one of said suggestions to said designer to modify said block of existing code where said existing code results fail to meet at least one of said goals associated with said circuit design.

11. The method according to claim 1, further comprising a storage medium recording a computer program instructing the steps (A) through (C).

12. A system comprising:
    a code editor configured to enable a designer to edit a file of a circuit design, said file containing a code written in a hardware description language; and
    an instructor tool configured to (i) characterize said code in said file while said designer is editing said code to generate a plurality of characterization results, said characterization results identifying (a) a first of a plurality of functions in said code and (b) a first of a plurality of coding styles being used to create said first function, and (ii) generate a plurality of suggestions to said designer to modify said code based on a comparison of a plurality of goals associated with said circuit design against said characterization results, wherein (1) said suggestions comprise (a) a first code template of said first function and (b) a second of said coding styles suitable to implement said first function, (2) said coals comprise at least two of (a) a timing goal, (b) a congestion goal, c) an area goal, (d) a design-for-test goal, (e) a power goal and (f) a coding style goal, and (3) all of said editing, said characterizing and said generating of said suggestions occur before any of (a) logic synthesis and (b) design rule checking are performed on said circuit design.

13. The system according to claim 12, wherein (i) said instructor tool comprises an interface tool configured to generate a graphical user interface to said designer enabling said designer to enter an identification of a second of said functions and (ii) said instructor tool is further configured to generate an additional one of said suggestions comprising a plurality of second code templates of said second function.

14. The system according to claim 12, wherein said instructor tool comprises a parse-and-map tool configured to characterize said code by parsing said code in said file to identify said functions defined in said code.

15. he system according to claim 14, wherein (i) said instructor tool comprises a library and (ii) said parse-and-map tool is further configured to map said functions to a plurality of entries in said library.

16. The system according to claim 15, wherein said entries in said library comprise (i) a plurality of multiplexer designs, (ii) a plurality of multiplier designs, (iii) a plurality of divider designs, (iv) a plurality of memory interface designs, (v) a plurality of memory array designs and (vi) a plurality of bus structure designs.

17. The system according to claim 15, wherein each of said entries in said library is associated with a plurality of attributes.

18. The system according to claim 17, wherein said attributes comprise (i) a timing attribute, (ii) a congestion attribute, (iii) an area attribute, (iv) a design for test attribute, (v) a power attribute and (vi) a coding style attribute.

19. The system according to claim 12, wherein said instructor tool further comprises an interface to at least one design checking tool configured to perform a check of said code when commanded by said instructor tool.

20. A system comprising:

means for enabling a designer to edit a file of a circuit design, said file containing a code written in a hardware description language; and means for (i) characterize said code in said file while said designer is editing said code to generate a plurality of characterization results, said characterization results identifying (a) a first of a plurality of functions in said code and (b) a first of a plurality of coding styles being used to create said first function and (ii) generate a plurality of suggestions to said designer to modify said code based on a comparison of a plurality of goals associated with said circuit design against said characterization results, wherein (1) said suggestions comprise (a) a first code template of said first function and (b) a second of said coding styles suitable to implement said first function, (2) said goals comprise at least two of (a) a timing goal, (b) a congestion goal, (c) an area goal, (d) a design-for-test goal, (e) a power goal and (f) a coding style goal, and (3) all of said editing, said characterizing and said generating of said suggestions occur before any of (a) logic synthesis and (b) design rule checking are performed on said circuit design.

* * * * *